United States Patent
Leobandung et al.

(10) Patent No.: US 10,242,991 B2
(45) Date of Patent: Mar. 26, 2019

(54) HIGHLY COMPACT FLOATING GATE ANALOG MEMORY

(71) Applicant: International Business Machines Corporation, Armonk, NY (US)

(72) Inventors: Effendi Leobandung, Stormville, NY (US); Yulong Li, Harsdale, NY (US); Paul M. Solomon, Yorktown Heights, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/640,090

(22) Filed: Jun. 30, 2017

(65) Prior Publication Data

US 2019/0006377 A1 Jan. 3, 2019

(51) Int. Cl.
*H01L 29/423* (2006.01)
*H01L 27/11521* (2017.01)
*H01L 29/788* (2006.01)
*H01L 29/66* (2006.01)

(52) U.S. Cl.
CPC .. *H01L 27/11521* (2013.01); *H01L 29/42328* (2013.01); *H01L 29/66484* (2013.01); *H01L 29/66833* (2013.01); *H01L 29/7885* (2013.01)

(58) Field of Classification Search
CPC ............. H01L 29/7783; H01L 29/7885; H01L 29/42328
See application file for complete search history.

(56) References Cited

U.S. PATENT DOCUMENTS

| 5,874,759 A | * | 2/1999 | Park | H01L 29/42324 |
| | | | | 257/314 |
| 6,034,892 A | * | 3/2000 | Choi | G11C 11/5621 |
| | | | | 365/185.01 |
| 6,125,060 A | * | 9/2000 | Chang | G11C 16/0416 |
| | | | | 257/E21.689 |

(Continued)

OTHER PUBLICATIONS

Chris Diorio et al., "A High-Resolution Nonvolatile Analog Memory Cell," Proceedings of the 1995 IEEE International Symposium on Circuits and Systems, vol. 3, pp. 2233-2236, 1995.

(Continued)

*Primary Examiner* — Frederick B Hargrove
(74) *Attorney, Agent, or Firm* — L. Jeffrey Kelly, Esq.; Hoffmann & Baron, LLP

(57) ABSTRACT

A method for forming a floating gate memory cell includes: forming an active region on a semiconductor substrate; forming a gate stack on the active region, the gate stack including a first gate layer defining a floating gate of the memory cell structure, a dielectric layer formed on the first gate layer, and a second gate layer defining a control gate of the memory cell structure formed on the dielectric layer; forming first and second source/drain regions in the active region, self-aligned with the gate stack; forming an erase/injection gate on at least a portion of the dielectric layer and spaced laterally from the control gate, the erase/injection gate being proximate to and above the floating gate; and forming multiple contacts providing electrical connection with the first and second source/drain regions, the control gate and the erase/injection gate.

15 Claims, 8 Drawing Sheets

(56) References Cited

U.S. PATENT DOCUMENTS

2002/0017680 A1* 2/2002 Na ................... H01L 29/42328
257/315
2017/0301683 A1* 10/2017 Chen ................ H01L 27/11546
2017/0345841 A1* 11/2017 Wu ................... H01L 27/11573

OTHER PUBLICATIONS

Tayfun Gokemen et al., "Acceleration of Deep Neural Network Training with Resistive Cross-Point Devices: Design Considerations," Frontiers in Neuroscience, vol. 10, Art. 333, pp. 1-13, Jul. 2016.

Fujio Masuoka et al., "A New Flash E2PROM Cell Using Triple Polysilicon Technology," IEDM 84, IC Div. Toshiba Corp., pp. 464-467, 1984.

Junjie Lu et al., "A 1 TOPS/W Analog Deep Machine-Learning Engine with Floating-Gate Storage in 0.13 µm CMOS," IEEE Journal of Solid-State Cir., vol. 50, No. 1, pp. 270-281, Jan. 2015.

Gijs van Steenwijk et al., "A Nonvolatile Analog Programmable Voltage Source Using the VIPMOS EEPROM Structure," IEEE Journal of Solid-State Cir., vol. 28, No. 7, pp. 784-788, Jul. 1993.

* cited by examiner

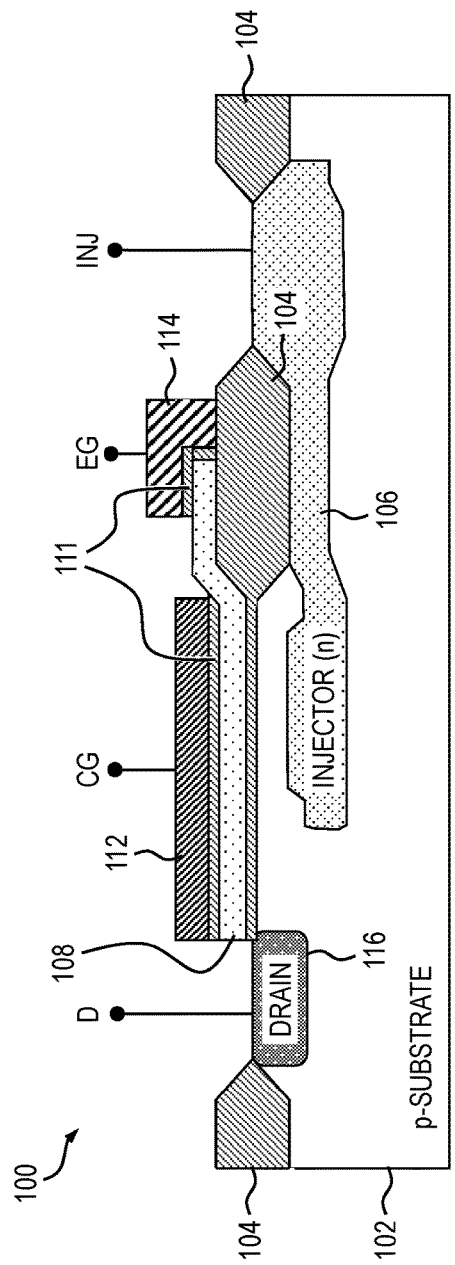

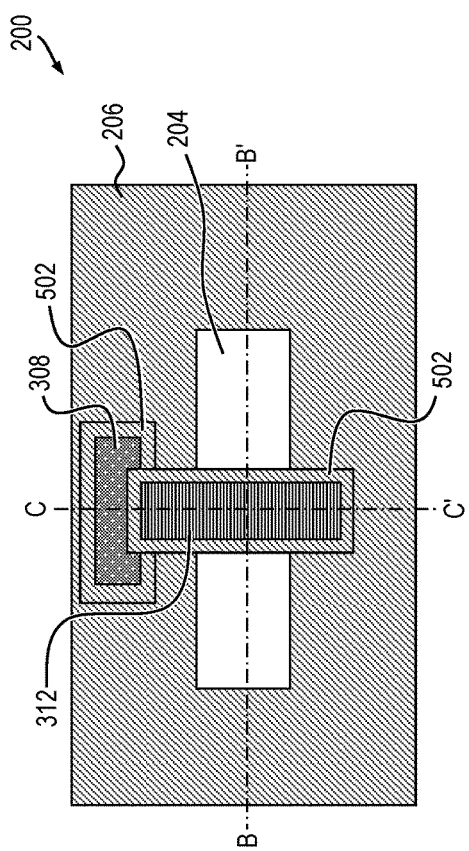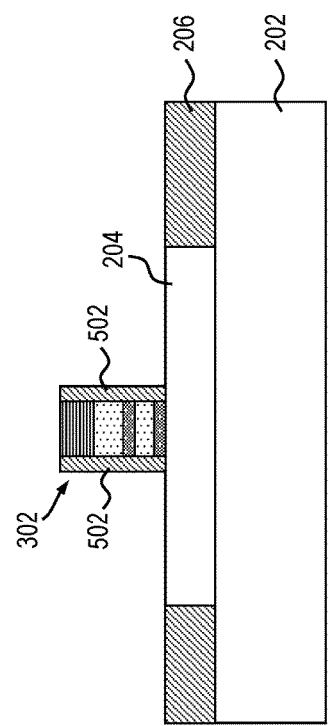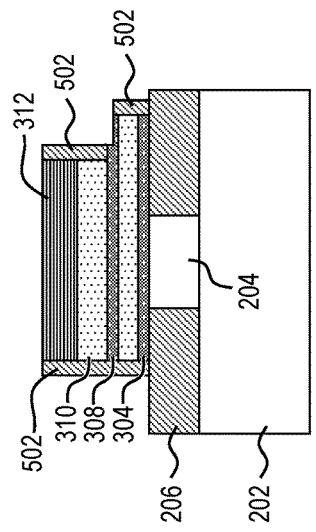

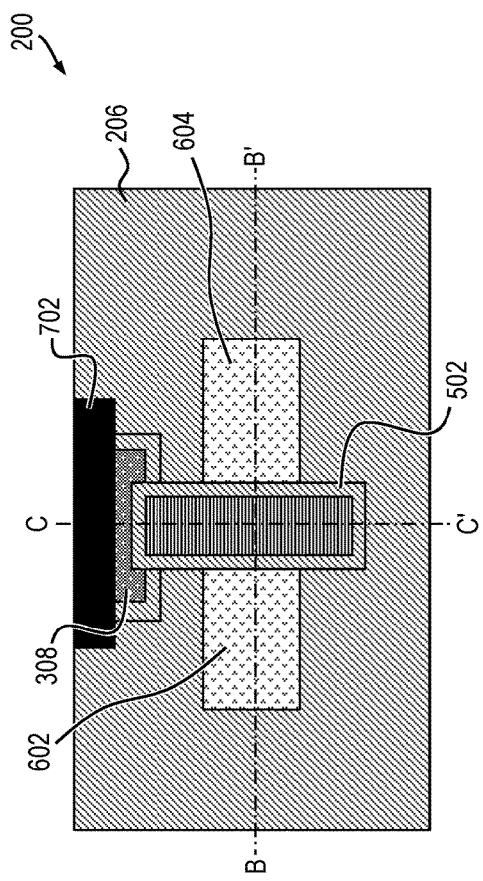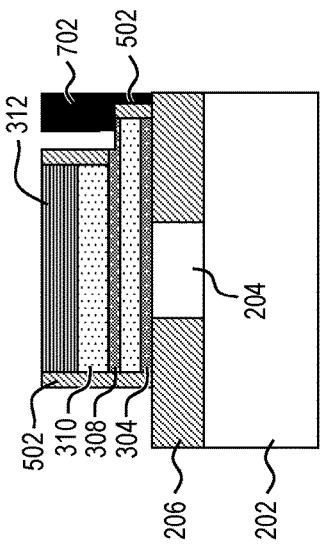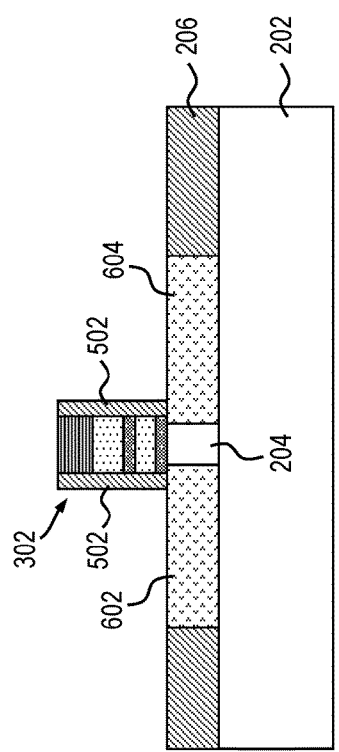

HIGHLY COMPACT FLOATING GATE ANALOG MEMORY

BACKGROUND

The present invention relates generally to the electrical, electronic and computer arts, and, more particularly, to memory circuitry.

One obstacle to the advancement of silicon neural networks has been the difficulty in storing analog weight values on-chip. Prior approaches have used capacitive storage with clocked refresh, or multi-bit digital storage. Both of these approaches, however, pay a substantial penalty at least in terms of memory cell size, complexity, resolution and power consumption.

Some conventional memory cells are based on a floating gate metal-oxide-semiconductor (MOS) transistor structure which includes a control gate, an erase gate and an injection gate, each gate being distinct and separated laterally from one another. This memory cell structure consumes a substantial amount of area, resulting in reduced storage density, particularly when used in a memory array application.

SUMMARY

Aspects according to embodiments of the present invention provide a floating gate analog memory cell architecture which has a reduced footprint, thereby achieving higher storage densities, particularly when using multiple memory cells, such as in a neural network storage array application. One or more embodiments of the invention achieve a highly compact floating gate analog memory cell structure and processing methods for making same, which utilizes a common erase gate and injection gate; that is, the erase gate and injection gate functionalities are shared. Moreover, the erase/injection gate and control gate are formed in a same plane, above and proximate to the floating gate, to thereby reduce the lateral spacing required by the memory cell. Memory arrays using this novel floating gate analog memory cell architecture beneficially achieve increased storage density and reduced processing complexity.

In accordance with an embodiment of the invention, a method for forming a highly compact floating gate analog memory cell includes: forming an active region on a semiconductor substrate; forming a gate stack on at least a portion of an upper surface of the active region, the gate stack including a first dielectric layer formed on the upper surface of the active region, a first gate layer defining a floating gate of the memory cell structure formed on at least a portion of an upper surface of the first dielectric layer, a second dielectric layer formed on at least a portion of an upper surface of the first gate layer, and a second gate layer defining a control gate of the memory cell structure formed on at least a portion of an upper surface of the second dielectric layer; forming first and second source/drain regions in the active region, the first and second source/drain regions being spaced laterally from one another and being self-aligned with the gate stack; forming an erase/injection gate on at least a portion of the upper surface of the second dielectric layer and spaced laterally from the control gate, the erase/injection gate being proximate to and above the floating gate; and forming a plurality of contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

In accordance with another embodiment of the invention, an exemplary highly compact floating gate analog memory cell includes an active region formed on a semiconductor substrate, a gate stack formed on at least a portion of an upper surface of the active region, and first and second source/drain regions formed in the active region, the first and second source/drain regions being spaced laterally from one another and being self-aligned with the gate stack. The gate stack includes a first dielectric layer formed on the upper surface of the active region, a first gate layer defining a floating gate of the memory cell structure formed on at least a portion of an upper surface of the first dielectric layer, a second dielectric layer formed on at least a portion of an upper surface of the first gate layer, and a second gate layer defining a control gate of the memory cell structure formed on at least a portion of an upper surface of the second dielectric layer. An erase/injection gate is formed on at least a portion of the upper surface of the second dielectric layer and is spaced laterally from the control gate, the erase/injection gate being proximate to and above the floating gate.

The memory cell structure further includes multiple contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

Techniques as disclosed herein can provide substantial beneficial technical effects. By way of example only and without limitation, one or more embodiments may provide one or more of the following advantages:

- a floating gate analog memory cell having a reduced footprint, thereby providing increased density;
- reduced memory cell processing complexity by eliminating one or more fabrication steps, including forming a buried injector structure in the cell;
- a floating gate analog memory cell structure which is compatible with standard complementary metal-oxide-semiconductor (CMOS) fabrication technology.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 1A is a cross-sectional view depicting at least a portion of a conventional floating gate storage device;

FIG. 1B depicts a symbolic representation of the illustrative floating gate device shown in FIG. 1A; and FIGS. 2A through 8C are top plan and corresponding cross-sectional views depicting intermediate processing steps in an overall semiconductor fabrication methodology for forming a floating gate analog memory cell having a reduced footprint, according to one or more embodiments of the invention.

Figure 2A:
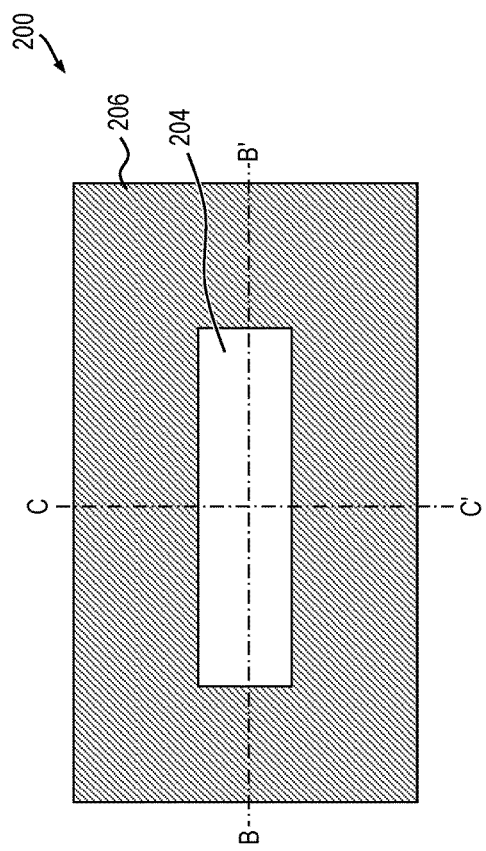
Figure 2C:
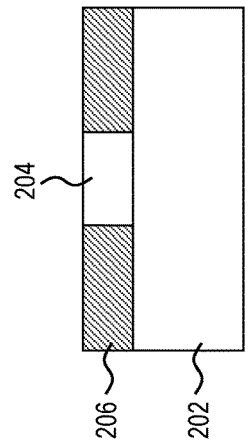
Figure 2B:
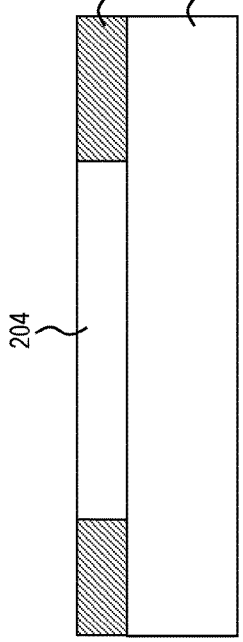

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of an illustrative floating gate analog memory cell structure having a reduced footprint, and processing methods for forming same. It is to be appreciated, however, that the specific structures and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Although the overall fabrication method and the structures for the disclosed embodiments are entirely novel, certain individual processing steps required to implement the structure and/or circuitry may utilize conventional semiconductor fabrication techniques and conventional semiconductor fabrication tooling. These techniques and tooling will already be familiar to one having ordinary skill in the relevant art given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), both of which are hereby incorporated by reference herein in their entireties for all purposes. It is emphasized that while some individual processing steps may be set forth herein, those steps are merely illustrative, and one skilled in the art may be familiar with several equally suitable alternatives that would also fall within the scope of the invention.

It is to be appreciated that the various layers, regions and/or components shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Aspects of the invention provide a highly compact analog memory cell design based on a floating gate metal-oxide-semiconductor field-effect transistor (MOSFET) device. It is to be appreciated that the term "metal" in the name MOSFET, in the context of modern semiconductor fabrication technologies, is now often considered a misnomer because the gate material commonly used in the device typically comprises a layer of polycrystalline silicon, or polysilicon. The term "oxide" in the name MOSFET is also considered to be a misnomer, since different dielectric materials other than oxide (e.g., nitrides, etc.) may be used depending on an application of the device (e.g., low voltage, high voltage, high speed, etc.). Furthermore, a metal-insulator-semiconductor field-effect transistor (MISFET) is a term that is often used synonymously with the term "MOSFET."

FIG. 1A is a cross-sectional view depicting at least a portion of an exemplary floating gate storage device 100; FIG. 1B depicts a symbolic representation 150 of the floating gate device shown in FIG. 1A, where "D" designates a drain terminal, "CG" designates a control gate terminal, "EG" designates an erase gate terminal, and "INJ" designates an injector terminal. With reference to FIG. 1A, the illustrative device 100 is formed on a substrate 102 of a first conductivity type, p-type in this embodiment, using a CMOS semiconductor fabrication process. The substrate is typically formed of crystalline silicon (Si), although other materials may be similarly employed (e.g., gallium arsenide, silicon-on-insulator (SOI), etc.). A LOCOS (local oxidation of silicon) microfabrication process is preferably performed whereby silicon dioxide ($SiO_2$), or an alternative dielectric material, is formed in selected areas 104 proximate an upper surface of the substrate 102, such that an interface between the silicon and silicon dioxide (Si—$SiO_2$ interface) is at a lower point than the rest of the silicon surface. A primary function of the LOCOS regions 104 is to electrically isolate MOS transistors and other devices from one another.

The floating gate storage device 100 further includes a buried injector region 106 of a second conductivity type, n-type in this embodiment, which is opposite in polarity to the first conductivity type. The n-type buried injector region 106 is formed at least partially under a floating gate 108 of the device 100. The injector 106 functions, at least in part, to move electrons into a channel region 110 formed in the substrate 102, proximate the upper surface of the substrate between the floating gate 108 and the buried injector region 106, through a channel hot electron (CHE) injection mechanism also known as hot-carrier injection. The buried injector region 106 is electrically accessible through the upper surface of the substrate 102, such as through an opening formed between adjacent LOCOS regions 104. A first electrode or other conductive structure (not explicitly shown, but implied) is preferably formed on the upper surface of the substrate 102 and electrically contacting the injector region 106. This first electrode and conductive interconnect wiring (e.g., first metal (M1) interconnect layer) is adapted to supply an injector signal, INJ, to the buried injector region 106.

As will be understood by those skilled in the art, in a standard floating gate memory device, there are essentially two ways to write the device (i.e., injecting electrons into the channel of the device). One approach is to use an injector in the device (e.g., injector region 106 shown in FIG. 1A) and create hot electrons to overcome a tunnel barrier. A second approach is to use an erase gate of the device and apply an opposite voltage (relative to an erase process) to cause electrons to tunnel into the channel. FIG. 1A shows the structure configured for the first approach.

At least a portion of the floating gate 108 is formed on a first (thin) dielectric layer 109, which in one or more embodiments is comprised of the same insulating material (e.g., silicon dioxide) as the LOCOS regions 104. The thin dielectric layer 109, which may be referred to herein as a tunnel oxide layer, electrically isolates the floating gate 108 from the channel region 110 of the device 100. The tunnel oxide layer 109 may be formed during the LOCOS process, using thermal oxidation of the silicon substrate, or by another process (e.g., deposition). A thinner tunnel oxide layer 109 (e.g., about 50-70 Å), as compared to a standard gate oxide thickness, can be used to increase coupling between the floating gate 108 and the channel region 110, leading to faster programming speeds (with localized trapped charges) and erasing with lower tunneling voltages. In this illustrative device, one end of the floating gate 108 is formed on the LOCOS region 104 and is therefore at a greater distance above the upper surface of the substrate 102 compared to an opposing end of the floating gate formed on the tunnel oxide layer 109.

A second dielectric layer 111 is formed on at least a portion of an upper surface and one or more sidewalls of the floating gate 108. The second dielectric layer 111 may be formed of the same material as the tunnel oxide layer 109 (e.g., silicon dioxide), or may be formed of a different insulting material (e.g., silicon nitride). A thickness of the second dielectric layer 111 is preferably greater relative to the thickness of the tunnel oxide layer 109. The second dielectric layer 111 may be formed using deposition followed by standard lithographic patterning and etching. A control gate 112 and an erase gate 114 are then formed on at least a portion of the second dielectric layer 111, and thus the second dielectric layer may be referred to as a gate oxide layer.

Specifically, the control gate 112 is formed on a portion of the gate oxide layer 111 above the channel region 110. The erase gate 114 is formed on the gate oxide layer 111, proximate a corner of the floating gate 108 and above the LOCOS region 104, and spaced laterally from the control gate 112. In one or more embodiments, the control gate 112 and erase gate 114 are formed of the same material, such as, for example, polysilicon, although the control and erase gates may be formed of different materials in alternative embodiments. Standard lithographic patterning and etching can be used to form the control gate 112 and erase gate 114. A resistance of the control and erase gates can be reduced using an optional silicide process, wherein silicide contacts are formed only in those areas in which deposited metal, which after annealing becomes a metal component of the silicide, is in direct contact with silicon; hence, the process is self-aligned. A second electrode (not explicitly shown, but implied) is formed on the control gate 112, and a third electrode (not explicitly shown, but implied) is formed on the erase gate 114. These second and third electrodes and corresponding conductive interconnect wiring (e.g., first metal (M1) interconnect layer) are adapted to supply a control gate signal, CG, to the control gate 112, and an erase gate signal, EG, to the erase gate 114, respectively.

A drain 116 is formed in the substrate 102 proximate the upper surface of the substrate and spaced laterally from the channel region 110 and the buried injector region 106. The drain 116 may be formed by introducing an impurity of a prescribed doping concentration into the substrate 102 using, for example, an implant process (e.g., ion implantation), followed by diffusion to form a doped region of a known conductivity type, n-type in this example. A source region is omitted in the exemplary floating gate storage device 100 shown in FIG. 1A merely for enhanced clarity; it will become apparent to one skilled in the art how to form the source region in the actual device. A fourth electrode or other conductive structure (not explicitly shown, but implied) is preferably formed on the upper surface of the substrate 102 and electrically contacting the drain region 116. A silicide process may be used to reduce the drain resistance, in a manner consistent with the silicide process which may be used to reduce the control gate 112 and erase gate 114 resistance.

In terms of operation of the storage device 100, programming may be achieved through hot carrier injection and erasing may be achieved through Fowler-Nordheim tunneling. More particularly, to program the storage device 100 to a first logic state, which in this embodiment is a logic "1" (normal) logic state, an electric field is applied to the floating gate 108 by supplying a voltage potential between the control gate 112 and injector 106 above a prescribed threshold. The applied electric field creates hot electrons between the injector region 106 and the drain 116. To change the device 100 to a second logic state, which in this embodiment is a logic "0" logic state, the device is erased through Fowler-Nordheim tunneling between the floating gate 108 and the erase gate 114. Fowler-Nordheim tunneling is the process whereby electrons tunnel through a barrier in the presence of a high electric field.

A change in control gate potential, $\Delta V_{CG}$, can be expressed as follows:

$$\Delta V_{CG} = \frac{I_{PROG} \cdot t_{PROG} \cdot P_{INJ}}{C_{CG}},$$

where $I_{PROG}$ represents programming current, $t_{PROG}$ represents programming time, $P_{INJ}$ represents injection probability and $C_{CG}$ represents a capacitance of the control gate (i.e., capacitance between the control gate and the floating gate).

One disadvantage of the floating gate memory cell structure 100 shown in FIG. 1A is that the control gate, erase gate and injection gate are all distinct and spaced laterally (i.e., in a substantially horizontal plane; parallel to a major plane of the substrate) from one another, thereby requiring a significant amount of area. This additional area requirement results in reduced storage density, particularly when a memory cell incorporating the floating gate memory cell structure 100 is used in a memory array or other storage application. Additionally, the floating gate memory cell structure 100 requires a buried injector 106, which undesirably increases processing complexity.

Embodiments of the invention provide a floating gate analog memory cell architecture having a reduced footprint, thereby achieving higher storage densities, particularly when using multiple memory cells, such as in a neural network storage array application. One or more embodiments of the invention achieve a highly compact floating gate analog memory cell structure and processing methods for making same, which utilizes a common erase gate and injection gate; that is, the erase gate and an injection gate functionality are incorporated into a single structure to thereby reduce the lateral spacing required by the memory cell. Moreover, in one or more embodiments, the erase/injection gate is formed in a same plane as the control gate, thus reducing the lateral separation between the control gate and erase/injection gate. Additionally, the floating gate memory cell architecture according to embodiments of the invention eliminates the need for forming a buried injector region in the memory cell. Consequently, memory arrays using this novel floating gate analog memory cell architecture achieve increased storage density and reduced processing complexity, among other benefits.

FIGS. 2A through 8C are top plan and corresponding cross-sectional views depicting intermediate processing steps in an overall semiconductor fabrication methodology for forming a floating gate analog memory cell structure 200 having a reduced footprint, according to one or more embodiments of the invention. With reference to FIGS. 2A-2C, FIG. 2A is a top plan view of at least a portion of an exemplary floating gate analog memory cell structure 200 at an early stage of processing, FIG. 2B is a cross-sectional view of the illustrative memory cell structure 200 shown in FIG. 2A taken along line B-B', and FIG. 2C is a cross-sectional view of the illustrative structure 200 shown in FIG. 2A taken along line C-C'. The floating gate analog memory cell structure 200, in one or more embodiments, is formed on a substrate 202, which may comprise silicon or an alternative material(s) suitable for use as a substrate (e.g., germanium (Ge), gallium arsenide (GaAs), indium phosphide (InP), silicon-on-insulator (SOI), etc.). The substrate 202 may be a silicon wafer, for example.

A semiconductor layer 204 is formed on an upper surface of the substrate 202, during the start of wafer fabrication. This semiconductor layer 204, which may be doped with an impurity (e.g., boron, phosphorous, arsenic, etc.) of a known conductivity type (e.g., p-type or n-type) and concentration amount, defines a region where active devices are formed, and is therefore referred to herein as an active region. The active region 204, in one or more embodiments, may be formed by an epitaxial growth or alternative process (e.g., deposition).

At least one isolation structure or region 206 is formed in the substrate 202 to prevent electric current leakage between semiconductor device components in adjacent active regions 204. In one or more embodiments, the isolation structure 206 comprises a shallow trench isolation (STI) structure formed, for example, by patterning and etching one or more trenches through the active region 204 to the underlying substrate 202, depositing one or more dielectric materials (e.g., silicon dioxide) to fill the trenches, and removing the excess dielectric material using a planarization technique, such as chemical-mechanical planarization/polishing (CMP) or the like. It is to be appreciated, however, that other isolation processes and structures are similarly contemplated (e.g., local oxidation of silicon (LOCOS)). The resulting structure comprises the active region 204 essentially formed as an island surrounded by the isolation structure 206, as shown in FIG. 2A.

Figure 3C:
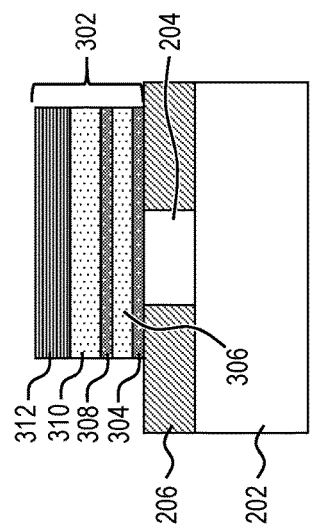
Figure 3A:
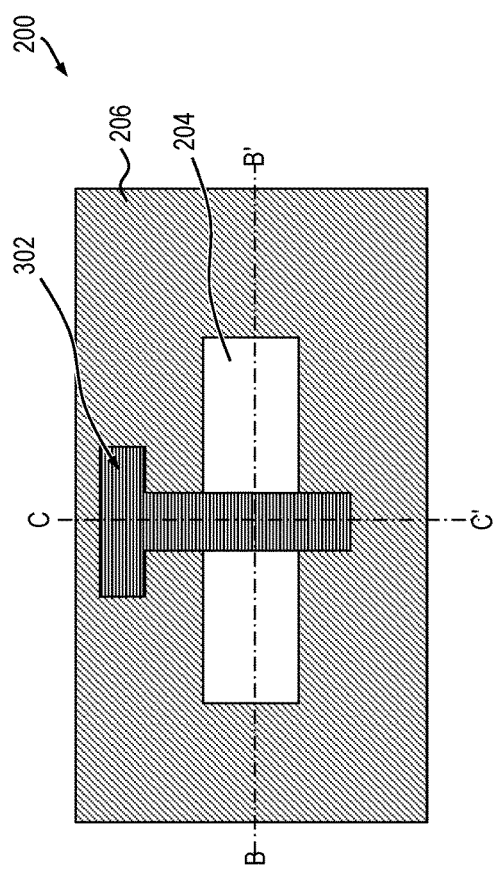
Figure 3B:
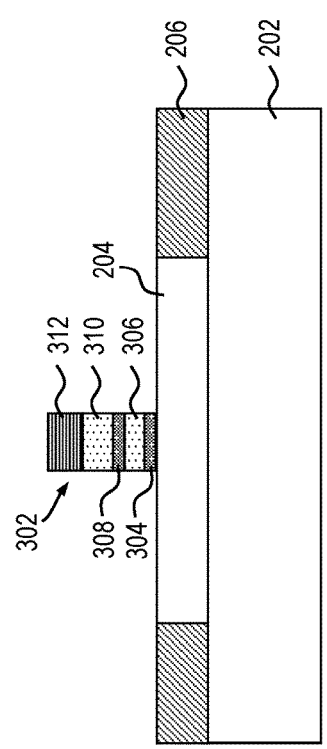

With reference now to FIGS. 3A-3C, which depict the formation of a gate stack 302 of the floating gate analog memory cell structure 200, FIG. 3A is a top plan view of at least a portion of the analog memory cell structure 200 including the gate stack 302, FIG. 3B is a cross-sectional view of the illustrative structure 200 shown in FIG. 3A taken along line B-B', and FIG. 3C is a cross-sectional view of the illustrative structure 200 shown in FIG. 3A taken along line C-C'. The gate stack 302, which in this embodiment is a multi-layer structure, is formed at least in part over the active region 204 of the memory cell structure 200. In the illustrative embodiment shown in FIGS. 3A-3C, at least a portion of the gate stack 302 is also formed over the isolation region 206.

In forming the gate stack 302, a first dielectric (i.e., insulating) layer 304 is formed on at least a portion of an upper surface of the active region 204, a first gate layer 306 is formed on at least a portion of an upper surface of the first dielectric layer 304, a second dielectric layer 308 is formed on at least a portion of an upper surface of the first gate layer 306, and a second gate layer 310 is formed on at least a portion of an upper surface of the second dielectric layer 308. The first gate layer 306, in one or more embodiments, will define a floating gate of the memory cell structure 200, and the second gate layer 310 will define a control gate of the memory cell structure 200.

A hard mask layer 312 is formed on at least a portion of an upper surface of the second gate layer 310 of the gate stack 302. The hard mask layer 312 is patterned using, for example, a standard lithographic process, and then the wafer is selectively etched to form the resulting gate stack 302 shown in FIGS. 3A-3C. It is to be appreciated that, although embodiments of the invention are described herein in the context of a planar device, one or more embodiments may be similarly applicable to other device types, such as, for example, fin-type field-effect transistors (FinFETs) or other devices, as will become apparent to those skilled in the art given the teachings herein.

In one or more embodiments, each of the first and second dielectric layers 304 and 308, respectively, forming the gate stack 302 comprises a high dielectric constant (high-k) material, such as, for example, an oxide (e.g., silicon dioxide), a nitride (e.g., silicon nitride), etc., having a cross-sectional thickness of about four nanometers (nm), although embodiments of the invention are not limited to any specific material types and/or dimensions of the first and second dielectric layers. Furthermore, the first and second dielectric layers 304, 308 need not be formed of the same material or dimensions. Likewise, in one or more embodiments, each of the first and second gate layers 306 and 310, respectively, forming the gate stack 302 comprises doped polysilicon or a metal (e.g., tungsten (W), titanium (Ti), tantalum (Ta), etc.) having a cross-sectional thickness of about 30 nm, although embodiments of the invention are not limited to any specific material types and/or dimensions of the first and second gate layers. Moreover, the first and second gate layers 306, 310 need not be formed of the same material or dimensions. The hard mask layer 312, in one or more embodiments, comprises a nitride (e.g., silicon nitride) having a cross-sectional thickness of about 30 nm. Embodiments of the invention are not limited to any specific type(s) of material and/or dimension of the hard mask layer 312.

In accordance with an aspect of the invention, a highly compact floating gate analog memory cell structure 200 is achieved, in one or more embodiments, by forming a control gate and a combined erase/injection gate of the memory cell structure 200 on the upper surface of the second dielectric layer 308. Forming the control gate, erase gate and injection gate in this manner—that is, in a vertical rather than a lateral dimension—reduces the overall footprint (i.e., area) of the memory cell structure 200 and thus increases a density of the memory cell structure.

Figure 4C:
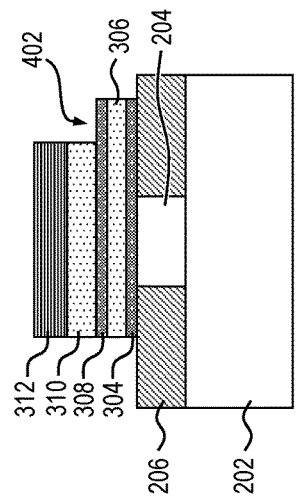
Figure 4A:
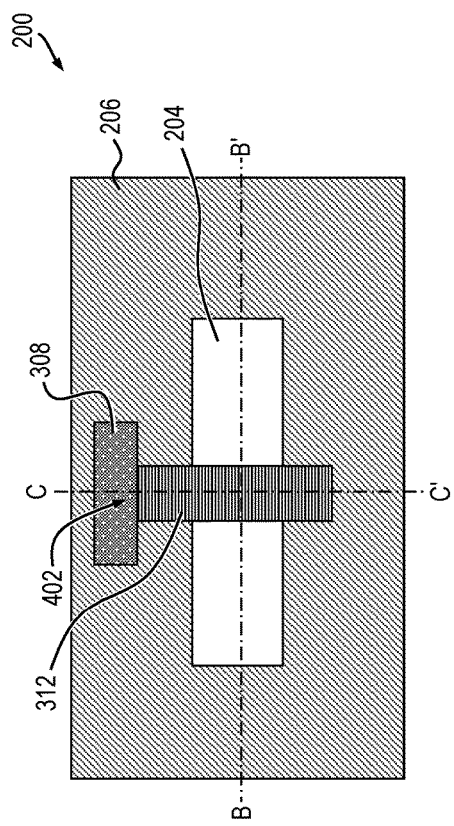
Figure 4B:
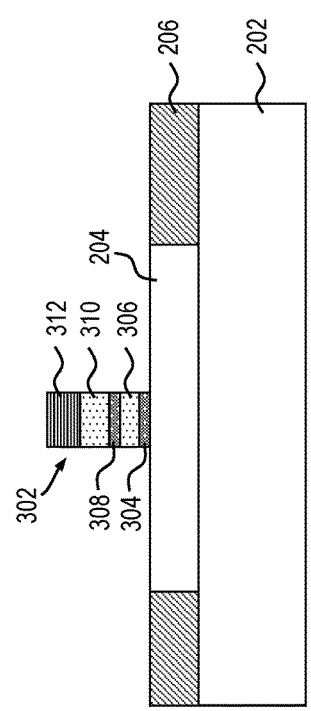

FIGS. 4A-4C depict the formation of an injection gate region 402 of the illustrative floating gate analog memory cell structure 200, according to an embodiment of the invention; FIG. 4A is a top plan view of at least a portion of the memory cell structure 200, FIG. 4B is a cross-sectional view of the memory cell structure 200 shown in FIG. 4A taken along line B-B', and FIG. 4C is a cross-sectional view of the memory cell structure 200 shown in FIG. 4A taken along line C-C'. As shown in FIGS. 4A and 4C, in this processing step, the hard mask 312 is patterned and etched to remove a portion of the second gate layer 310, thereby exposing a portion of the underlying second dielectric layer 308. An etchant that is selective to the material forming the second gate layer 310 is preferably used, with the second dielectric layer 308 serving as an etch-stop layer. The removed portions of the hard mask 312 and second gate layer 310 will define the injection gate region 402 where an erase/injection gate of the analog memory cell structure 200 is subsequently formed, with the second dielectric layer 308 serving as a gate oxide layer for both the control gate 310 and the erase/injection gate.

It is to be appreciated that during the etching process, the portion of the second dielectric layer 308 which is exposed in the injection gate region 402 is preferably reduced somewhat in thickness; that is, the portion of the second dielectric layer 308 under the control gate 310 may be formed having a different thickness relative to the erase/injection gate oxide thickness. By way of example only and without limitation, assuming the second dielectric layer 308 is formed having a thickness of about 4.0 nm, the exposed portion of the second dielectric layer 308 in the injection gate region 402 can be etched down to about 2.0 nm, while the portion of the second dielectric layer 308 protected by the hard mask layer 312 remains at 4.0 nm in thickness. This will provide an erase/injection gate having a thinner gate oxide compared to a thickness of the control gate oxide, which may lower a required potential to effectively tunnel through the erase/injection gate oxide.

FIGS. 5A-5C depict the formation of dielectric spacers 502 on the gate stack 302 of the illustrative floating gate analog memory cell structure 200, according to an embodiment of the invention; FIG. 5A is a top plan view of at least a portion of the memory cell structure 200, FIG. 5B is a cross-sectional view of the memory cell structure 200 shown in FIG. 5A taken along line B-B', and FIG. 5C is a cross-sectional view of the memory cell structure 200 shown in FIG. 5A taken along line C-C'. Specifically, in one or more embodiments, a dielectric layer (e.g., silicon dioxide, etc.) is deposited over the upper surface of the wafer, or at least over the gate stack 302, and the wafer is then selectively etched in such a way that the dielectric layer formed on the horizontal surfaces of the structure 200, including the active region 204, isolation structure 206, hard mask layer 312 and the portion of the second dielectric layer 308 in the injection gate region 402, are removed and the dielectric layer formed on the substantially vertical surfaces, including sidewalls of the gate stack 302 as shown in FIGS. 5A-5C, remain to form the dielectric spacers 502. The dielectric spacers 502 are used to physically separate subsequently formed source/drain regions from a gate/channel region (204) in the memory cell structure 200.

Figure 6A:
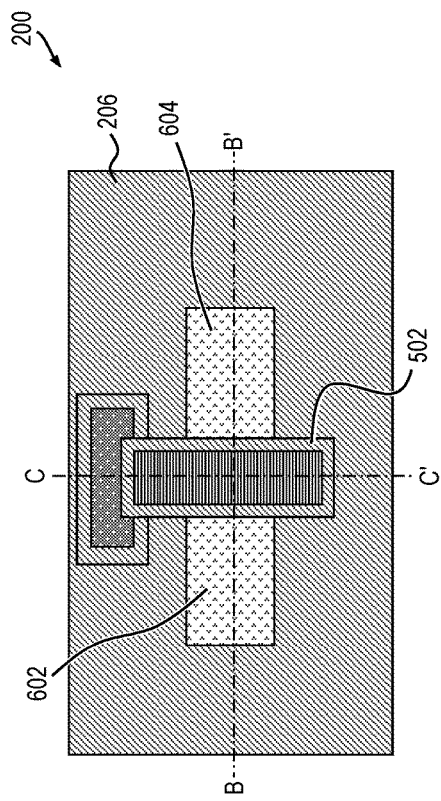
Figure 6B:
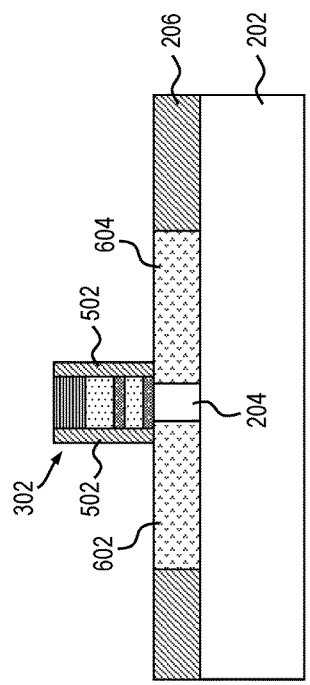
Figure 6C:
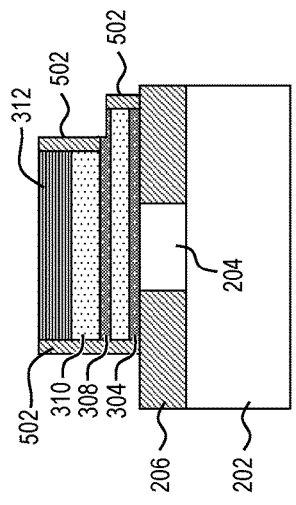
Figure 8A:
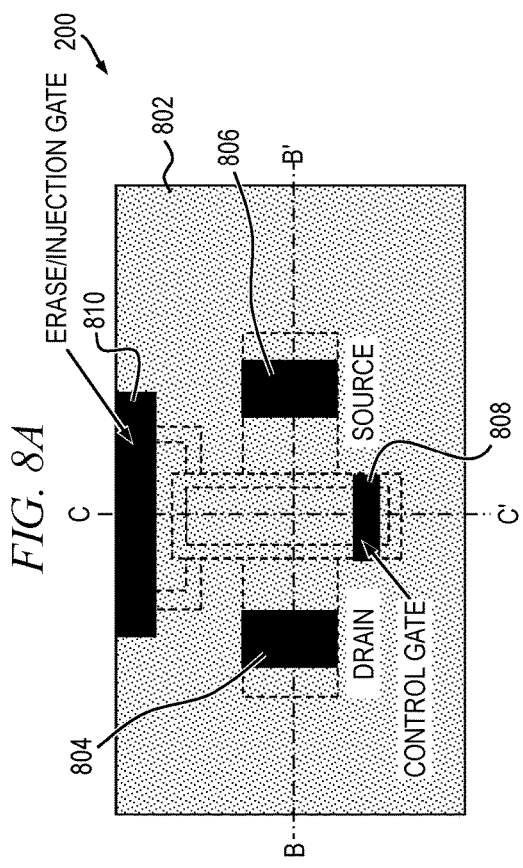
Figure 8B:
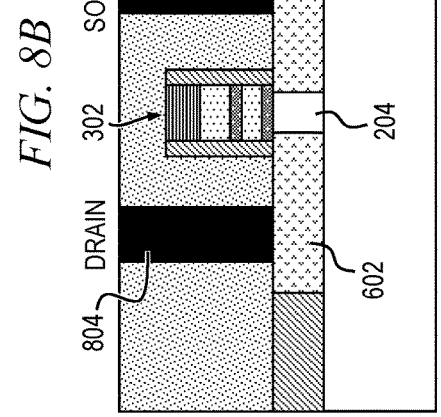
Figure 8C:
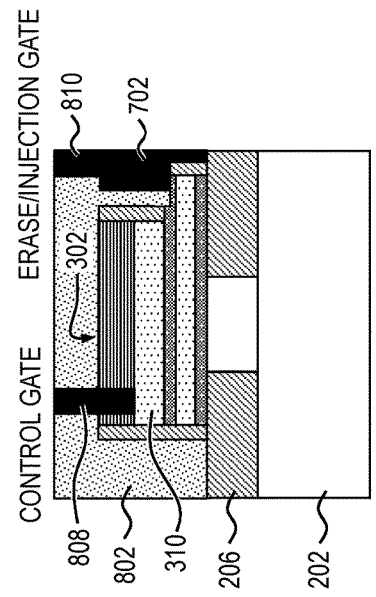

Next, in accordance with one or more embodiments of the invention, drain and source regions, 602 and 604, respectively, of the floating gate analog memory cell structure 200 are defined, as shown in FIGS. 6A-6C, where FIG. 6A is a top plan view of at least a portion of the memory cell structure 200, FIG. 6B is a cross-sectional view of the memory cell structure 200 shown in FIG. 6A taken along line B-B', and FIG. 6C is a cross-sectional view of the memory cell structure 200 shown in FIG. 6A taken along line C-C'. The drain and source regions 602, 604 may be formed, in one or more embodiments, by an implant or an epitaxial process. Using an implant process, the active region 204 is doped with an impurity (i.e., dopant) of a known concentration level and conductivity type (e.g., n-type or p-type), such as, for example, boron, arsenic or phosphorous, although the invention is not restricted to any particular impurity and/or doping levels. Subsequently, an anneal process is used to drive the implanted dopant deeper into the respective drain and source regions 602, 604. The drain and source regions 602, 604 will be self-aligned with the gate stack 302 and sidewall spacers 502, although as a result of the anneal process, the impurity may be driven slightly under the gate stack, depending upon the temperature and duration of the anneal. However, the drain region 602 and source region 604 will remain laterally spaced from one another by the portion of the active region 204 that was not subjected to the implant.

It is to be appreciated that, because an MOS device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

FIGS. 7A-7C depict the formation of an erase/injection gate 702 in the injection gate region 402 (see FIG. 4C) of the illustrative analog memory cell structure 200, according to an embodiment of the invention, where FIG. 7A is a top plan view of at least a portion of the memory cell structure 200, FIG. 7B is a cross-sectional view of the memory cell structure 200 shown in FIG. 7A taken along line B-B', and FIG. 7C is a cross-sectional view of the memory cell structure 200 shown in FIG. 7A taken along line C-C'. In one or more embodiments, the erase/injection gate 702 is formed by depositing a conductive material, such as, for example, tungsten or doped polysilicon, in the injection gate region 402, such as over a corner of the gate stack 402 opposite the control gate 310, on a portion of the upper surface of the second dielectric layer 308, the sidewall spacer 502 and edge of the isolation structure or region 206, as depicted in FIG. 7C. The deposited conductive material is then patterned and etched to define the erase/injection gate 702 in a desired shape and dimension; embodiments of the invention are not limited to any specific shape and/or dimensions of the erase/injection gate 702. The erase/injection gate is thus formed proximate to and above the floating gate 306. As previously stated, the erase/injection gate oxide under the erase/injection gate 702, which is formed from the portion of the second dielectric layer 308 not protected by the hard mask layer 312, is preferably thinned (e.g., by etching) compared to the gate oxide formed under the control gate 310. Having a thinner gate oxide under the erase/injection gate will beneficially lower the required potential for removing charge from or injecting charge onto the floating gate 306.

The memory cell structure 200 is planarized, such as by depositing an insulating layer 802 over the structure (e.g., on upper surfaces of the isolation structure 206, drain and source regions 602, 604, and gate stack 302) followed by chemical mechanical polishing (CMP), or an alternative planarization process. In one or more embodiments, openings are formed through the insulating layer 802 to expose at least a portion of the drain region 602, source region 604, control gate 310 and erase/injection gate 702. The openings are then filled with a conductive material, for example by using a deposition process, to form contacts to the corresponding elements of the memory cell structure 200. More particularly, a drain contact 804 is formed for providing electrical connection with the underlying drain region 602, a source contact 806 is formed for providing electrical connection with the underlying source region 604, a control gate contact 808 is formed for providing electrical connection with the underlying control gate 310, and an erase/injection gate contact 810 is formed for providing electrical connection with the underlying erase/injection gate 702.

Advantageously, a ratio of erase/injection capacitance to control gate capacitance can be controlled as desired using the process methodology according to one or more embodiments of the invention. This is achieved, in one or more embodiments, by controlling the respective thicknesses of the different gate dielectric layers 304 and 308, including the thinned portion of the second dielectric layer 308 in the injection gate region 402; capacitance has a direct correlation to gate dielectric thickness.

Given the discussion thus far, it will be appreciated that, in general terms, an exemplary method for forming a highly compact floating gate analog memory cell includes: forming an active region on a semiconductor substrate; forming a gate stack on at least a portion of an upper surface of the active region, the gate stack including a first dielectric layer formed on the upper surface of the active region, a first gate layer defining a floating gate of the memory cell structure formed on at least a portion of an upper surface of the first dielectric layer, a second dielectric layer formed on at least a portion of an upper surface of the first gate layer, and a second gate layer defining a control gate of the memory cell structure formed on at least a portion of an upper surface of the second dielectric layer; forming first and second source/drain regions in the active region, the first and second source/drain regions being spaced laterally from one another and being self-aligned with the gate stack; forming an erase/injection gate on at least a portion of the upper surface of the second dielectric layer and spaced laterally from the control gate, the erase/injection gate being proximate to and above the floating gate; and forming a plurality of contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

Given the discussion thus far, it will be appreciated that, in general terms, an exemplary highly compact floating gate analog memory cell includes an active region formed on a semiconductor substrate, a gate stack formed on at least a portion of an upper surface of the active region, and first and second source/drain regions formed in the active region, the first and second source/drain regions being spaced laterally from one another and being self-aligned with the gate stack. The gate stack includes a first dielectric layer formed on the upper surface of the active region, a first gate layer defining a floating gate of the memory cell structure formed on at least a portion of an upper surface of the first dielectric layer, a second dielectric layer formed on at least a portion of an upper surface of the first gate layer, and a second gate layer defining a control gate of the memory cell structure formed on at least a portion of an upper surface of the second dielectric layer. An erase/injection gate is formed on at least a portion of the upper surface of the second dielectric layer and is spaced laterally from the control gate, the erase/injection gate being proximate to and above the floating gate.

The memory cell structure further includes multiple contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

At least a portion of the apparatus, methods and system described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having a highly compact floating gate analog memory cell structure formed in accordance with one or more of the exemplary embodiments.

The illustrations of embodiments described herein are intended to provide a general understanding of the various embodiments, and they are not intended to serve as a complete description of all the elements and/or features of apparatus, methods and systems that might make use of the structures, devices and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of exemplary methods described herein may occur out of the order described or noted in the figures (where shown). For example, two steps described or shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below," where used, are intended to indicate positioning of elements or structures relative to each other as opposed to absolute elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method for forming a floating gate analog memory cell structure comprises:
    forming an active region on a semiconductor substrate;
    forming a gate stack on at least a portion of an upper surface of the active region, the gate stack including a first dielectric layer formed on the upper surface of the active region, a first gate layer defining a floating gate of the floating gate analog memory cell structure formed on at least a portion of an upper surface of the first dielectric layer, a second dielectric layer formed on at least a portion of an upper surface of the first gate layer, and a second gate layer defining a control gate of the floating gate analog memory cell structure formed on at least a portion of an upper surface of the second dielectric layer;
    forming first and second source/drain regions in the active region, the first and second source/drain regions being spaced laterally from one another and being self-aligned with the gate stack;
    forming an erase/injection gate on at least a portion of the upper surface of the second dielectric layer and spaced laterally from the control gate, the erase/injection gate being proximate to and above the floating gate and being spaced laterally from the active region; and
    forming a plurality of contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

2. The method of claim 1, further comprising forming an isolation structure on the semiconductor substrate surrounding at least a portion of the active region, the isolation structure electrically isolating the active region from at least one other adjacent active region formed on the semiconductor substrate.

3. The method of claim 1, further comprising forming the second dielectric layer having a first portion underlying the control gate and a second portion underlying the erase/injection gate, the first portion having a first cross-sectional thickness and the second portion having a second cross-sectional thickness which is less than the first cross-sectional thickness.

4. The method of claim 1, further comprising:
    depositing an insulating layer over the floating gate analog memory cell structure; and
    planarizing the floating gate analog memory cell structure such that the insulating layer is in substantially a same plane as the plurality of contacts.

5. The method of claim 4, wherein planarizing the floating gate analog memory cell structure comprises performing chemical mechanical polishing (CMP).

6. The method of claim 4, wherein forming the plurality of contacts comprises:
    forming at least first, second, third and fourth openings through the insulating layer to expose at least a portion of the first and second source/drain regions, the control gate and the erase/injection gate, respectively; and
    filling the first, second, third and fourth openings with a conductive material to form the first, second, third and fourth of the contacts, respectively.

7. The method of claim 1, wherein the gate stack further comprises a hard mask layer formed on an upper surface of the second gate layer.

8. The method of claim 1, further comprising forming dielectric spacers on sidewalls of the gate stack.

9. The method of claim 8, wherein forming the dielectric spacers comprises:
    forming a third dielectric layer over an upper surface of the of floating gate analog memory cell structure; and
    selectively etching the floating gate analog memory cell structure whereby one or more portions of the third dielectric layer formed on substantially horizontal surfaces of the floating gate analog memory cell structure are removed, and one or more portions of the third dielectric layer formed on substantially vertical surfaces remain to thereby form the dielectric spacers.

10. The method of claim 1, wherein forming the erase/injection gate comprises:
    forming a hard mask layer on a first portion of an upper surface of the second gate layer to define the control gate of the floating gate analog memory cell structure; and
    selectively etching the floating gate analog memory cell structure to remove a second portion of the second gate layer and any portion of the hard mask layer that is covering the second portion of the second gate layer, thereby exposing a portion of the upper surface of the second dielectric layer defining an injection gate region on which the erase/injection gate is formed, the second portion of the second gate layer defining the injection gate region of the floating gate analog memory cell structure.

11. A floating gate analog memory cell structure, comprising:
- an active region formed on a semiconductor substrate;
- a gate stack formed on at least a portion of an upper surface of the active region, the gate stack including a first dielectric layer formed on the upper surface of the active region, a first gate layer defining a floating gate of the floating gate analog memory cell structure formed on at least a portion of an upper surface of the first dielectric layer, a second dielectric layer formed on at least a portion of an upper surface of the first gate layer, and a second gate layer defining a control gate of the floating gate analog memory cell structure formed on at least a portion of an upper surface of the second dielectric layer;
- first and second source/drain regions formed in the active region, the first and second source/drain regions being spaced laterally from one another and being self-aligned with the gate stack;
- an erase/injection gate formed on at least a portion of the upper surface of the second dielectric layer and spaced laterally from the control gate, the erase/injection gate being proximate to and above the floating gate and being spaced laterally from the active region; and
- a plurality of contacts, a first of the contacts being formed on the first source/drain region and providing electrical connection with the first source/drain region, a second of the contacts being formed on the second source/drain region and providing electrical connection with the second source/drain region, a third of the contacts being formed on the control gate and providing electrical connection with the control gate, and a fourth of the contacts being formed on the erase/injection gate and providing electrical connection with the erase/injection gate.

12. The memory cell of claim 11, further comprising an isolation structure formed on the semiconductor substrate surrounding at least a portion of the active region, the isolation structure electrically isolating the active region from at least one other adjacent active region formed on the semiconductor substrate.

13. The memory cell of claim 11, wherein the second dielectric layer comprises a first portion underlying the control gate and a second portion underlying the erase/injection gate, the first portion having a first cross-sectional thickness and the second portion having a second cross-sectional thickness which is less than the first cross-sectional thickness.

14. The memory cell of claim 11, further comprising an insulating layer formed over the floating gate analog memory cell structure, an upper surface of the insulating layer being substantially planar with the plurality of contacts.

15. The memory cell of claim 11, further comprising dielectric spacers formed on at least sidewalls of the gate stack.

* * * * *